United States Patent [19]

Reinitz et al.

[11] Patent Number: 4,517,515
[45] Date of Patent: May 14, 1985

[54] MAGNETOMETER WITH A SOLID-STATE MAGNETIC-FIELD SENSING MEANS

[75] Inventors: Karl Reinitz, Arnold; Lynn Hart, Columbia, both of Md.

[73] Assignee: The United States of America as represented by the Secretary of the Navy, Washington, D.C.

[21] Appl. No.: 270,035

[22] Filed: Jun. 3, 1981

[51] Int. Cl.$^3$ .............................................. G01R 33/02
[52] U.S. Cl. ..................................... 324/252; 338/32 R
[58] Field of Search ....................... 324/249, 251, 252; 338/32 R; 148/403

[56] References Cited

U.S. PATENT DOCUMENTS

| | | | |
|---|---|---|---|
| 2,260,589 | 10/1941 | Smith et al. | 324/252 |
| 2,599,550 | 6/1952 | Fraser | 324/252 |
| 2,911,601 | 11/1959 | Gunn et al. | 333/81 |
| 2,997,648 | 8/1961 | Bozorth | 324/252 |
| 3,025,461 | 3/1962 | Snellen | 324/252 |
| 3,187,254 | 6/1965 | Wasserman et al. | 324/252 |
| 3,260,932 | 7/1966 | Weiss et al. | 324/252 |
| 3,390,330 | 6/1968 | Meyerhoff et al. | 324/248 |
| 3,519,899 | 7/1970 | Yamada | 324/252 |
| 3,535,626 | 10/1970 | Uemure et al. | 324/252 |
| 3,546,579 | 12/1970 | Paul et al. | 324/251 |
| 3,716,781 | 2/1973 | Almasi et al. | 338/32 R |
| 3,942,258 | 3/1976 | Stucki et al. | 33/361 |
| 4,075,671 | 2/1978 | Cheatham | 360/113 |

OTHER PUBLICATIONS

Wohlfarth, "Ferromagnetic Materials", Jul. 1981, pp. 121–124, North–Holland Publishing Co.

*Primary Examiner*—Gerard R. Strecker
*Assistant Examiner*—Walter E. Snow
*Attorney, Agent, or Firm*—Robert F. Beers; Arthur L. Branning; Thomas E. McDonnell

[57] ABSTRACT

A magnetic-field detection device useful as a sensitive magnetometer. The device employs a solid-state field-sensing element which experiences a change in permeability when it is exposed to a magnetic field. The change in permeability results in a change in skin depth and therefore in resistance offered by the element to passage of a high-frequency alternating current. The element is used as one arm of a balanced bridge circuit to which an A.C. voltage is applied. Upon exposure to a magnetic field, the bridge is rebalanced to a null, the amount of current flow or rebalancing being measures of the magnetic field strength.

3 Claims, 5 Drawing Figures

MAGNETOMETER WITH A SOLID-STATE MAGNETIC-FIELD SENSING MEANS

BACKGROUND OF THE INVENTION

This invention relates to magnetic field detectors and especially to an improved solid-state magnetic-field detector.

Currently, there are several types of magnetometers in use. The more prominent of these are the superconducting magnetometers, the gaseous magnetometers and the fluxgate units. Superconducting magnetometers are the most sensitive (about $10^{-5}\ \gamma/(Hz)^{\frac{1}{2}}$), followed by the gaseous units (about $10^{-3}\ \gamma/(Hz)^{\frac{1}{2}}$) and the fluxgate units (about $0.5\ \gamma/(Hz)^{\frac{1}{2}}$). A drawback of the sensitive superconducting units is the very low temperatures (liquid helium temperature, for example) required for their operation necessitating, the use of heavy and awkward equipment. A magnetic-field detector which requires no cooling apparatus and has excellent sensitivity would, therefore, be very desirable.

SUMMARY OF THE INVENTION

An object of this invention is to provide a magnetic-field detector which can be made very sensitive.

Another object is to provide a magnetic-field detector which is not temperature-dependent.

These objects and others are attained by the use of a high-permeability, solid-state material the permeability of which changes as a function of the applied magnetic field. The fractional change of permeability, $\Delta\mu/\mu$, can be monitored, for example, by a bridge circuit, since the output of the bridge circuit is proportional to the fractional change in permeability, $\Delta\mu/\mu$.

The material should have a hysteresis curve characterized by very steep sides so that its shape is substantially rectangular; the steeper the sides, the better the sensitivity of the instrument.

The magnetometer described hereinafter operates at ambient temperature or at any temperature below the Curie point of the solid-state material (about 300° C.).

The magnetometer operates on the principle of the indirect magnetoresistive effect of certain high-permeability materials. The permeability of such materials changes when they are exposed to variable magnetic fields. The skin depth (therefore the resistance) and the self-inductance also change, resulting in a change in the skin depth-to-wire radius ratio. The measure of this sheet resistance and inductance change caused by the variation in skin depth is then usable as an indication of change in magnetic field strength.

DETAILED DESCRIPTION OF THE INVENTION

The resistance of a bar, strip, or slab, of material is given by $$R = \frac{\rho L}{WT} \quad (1)$$

where $\rho$ is the resistivity of the material and L, W and T are the length, width and thickness of the strip. When alternating current (AC) is sent through the rod, the skin depth of the rod through which the current flows is given by $$\delta = \sqrt{\frac{2\rho}{\omega\mu_o\mu}} \quad (2)$$

where
 $\omega$ is the frequency of the AC
 $\mu$ is the relative permeability of the material
 $\mu_o$ is the permeability of free space
For AC operation, T in equation (1) can be replaced by skin depth, $\delta$, from equation (2). Thus $$R = \frac{L}{W} \sqrt{\frac{\omega\rho\mu_o\mu}{2}} \quad (3)$$

For some material, $\mu$ is a function of the magnetic field strength, H, and for these materials a resistance change can be observed in the strip of material as the magnetic field across it is varied in strength. These materials are different from ordinary magnetoresistive materials in which the magnetic field directly affects the resistance by changing the molecular structure of the material. The first class of material, in which the magnetic field affects the permeability and skin depth may be referred to herein as "magneperm" material.

Figure 1:
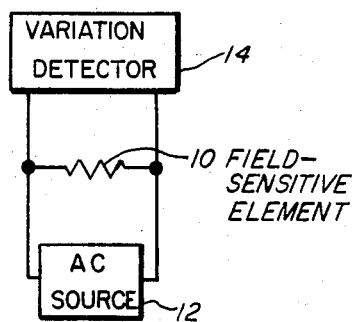
FIG. 1 is a circuit diagram of the invention combination.

FIG. 1 shows a generalized combination for utilizing a magnetic-field-sensitive element 10 to indicate a magnetic field. The field-sensitive element is fabricated from a high-permeability magneperm material whose permeability changes as a function of the strength of the magnetic field through it, a preferred material being Metglas alloy 2826MB made by Allied Chemical Company, Morristown, N.J. This is a nickel-iron metallic glass with the formula $Fe_{40}Ni_{38}Mo_4B_{18}$. Its maximum permeability is 750,000 and it has a steep hysteresis loop, low coercive force (0.008 Oersted), high resistivity ($160\times10^{-6}$ ohm-cm) and low thermal coefficient of resistance (TCR=130 ppm/°C.). Another material which can be used is the Co-netic alloy made by the Magnetic Shield Division of the Perfection Mica Company of Bensenville, Ill. For this material, $\mu_{max}=500,000$, coercive force is 0.01 oersted, electrical resistivity is $56\times10^{-6}$ ohm-cm, and TCR≈1,000 ppm/°C. It is believed that its composition is essentially that of Molybdenum Permalloy.

The Metglas material was cut into a strip measuring $4''\times0.002''\times0.002''$. The larger the length-to-diameter ratio (here, 2,000), the more effective is the penetration of the applied field into the material (i.e., the demagnetization factor is smaller). The field (H) inside the strip of Metglas at $\mu_{max}$ was 60% of the applied field. The strip was fabricated by a photo-etching technique. Beryllia plates were used to sandwich the strip. Bonding pads were placed on the beryllia plates before hand and the plates were welded together after the strip was provided with electrical connection terminals. The beryllia plates were used to provide a heat sink since it is important to provide thermal stability for the field-sensitive element. The beryllia plates were then epoxied to a phenolic sled, the sled was placed in a beryllia tube, and wires from the sensitive element coming through holes in the tube were joined to coaxial cables outside the tube.

The coaxial cables are connected to a source of high-frequency AC voltage 12 and an imbalance detector 14 is placed across the field-sensitive element 10. If a magnetic field is placed across the element 10 and changes in intensity, or if the element 10 enters a magnetic field, its permeability changes. The change in skin depth due to this permeability change results in a change in the resistance of the element 10 which is sensed by the variation detector 14.

Figure 2:
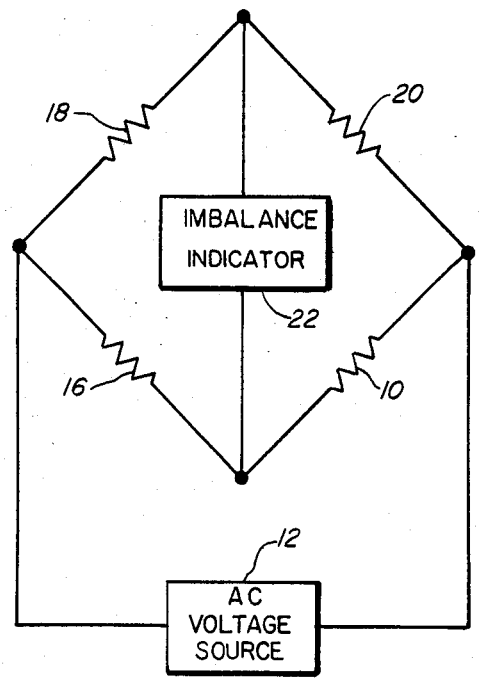
FIG. 2 is a circuit diagram showing the use of a bridge circuit for determining a variation in the condition of the magnetic-field-sensitive element.
Figure 3:
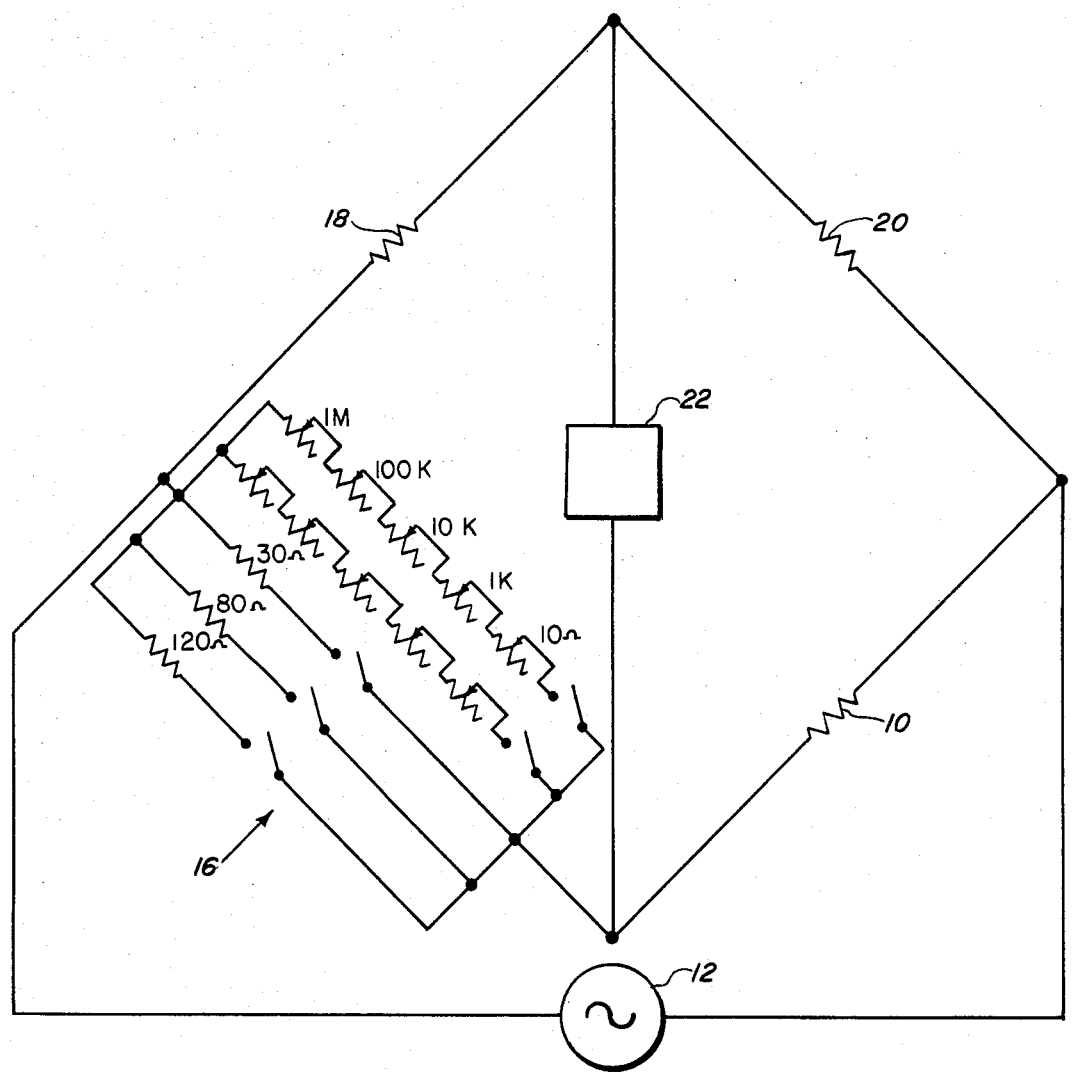
FIG. 3 is a circuit diagram showing a possible configuration for the resistance-compensating element.

A practical application of this circuit is shown in FIG. 2 where the variation detector is in the form of a bridge circuit with a bridge imbalance detector 22 which, may, for example, be an ammeter. Elements 18 and 20 are resistors of equal value, e.g., about 400 ohms. Element 16 should be a resistance-compensating element for balancing the bridge and one configuration that may be used is shown in FIG. 3. Values for the resistors are indicated. Low TCR resistors should be used and the potentiometers should be low-noise types. Even better balancing can be obtained by utilizing adjustable capacitor banks across the balancing network, the fixed resistors or the field-sensitive element.

The unbalanced condition of the bridge when the sensitive element 10 senses a magnetic field change is indicated by a current reading on the ammeter 22. The bridge is brought back to balance by adjusting the compensating network 16. A measure of the magnetic field strength may be obtained by the amount of current through the ammeter or the amount of resistance change in the compensating network.

Figure 4:
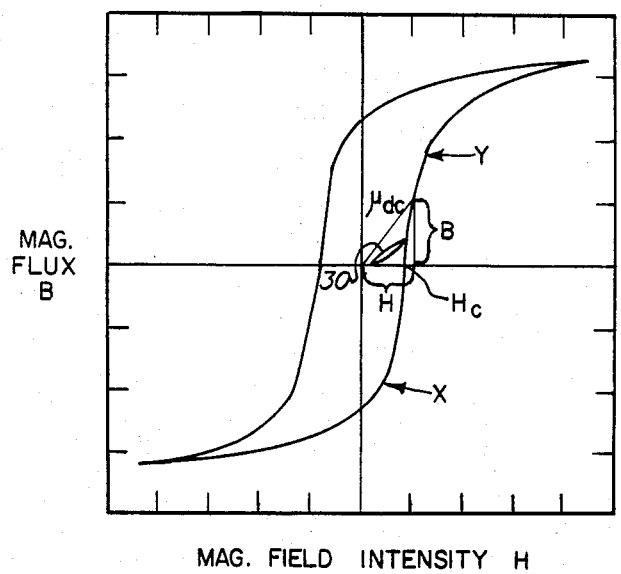
FIG. 4 is a hysteresis curve of a material suitable for use in a field-sensitive element in this invention.

A typical hysteresis curve for the type of material suitable for use in this invention as a magnetic-field-sensing element is shown in FIG. 4. The curve is seen to be quite steep in the region from about point X to about point Y. Such a steep region also exists, of course, on the negative side of the curve. The DC permeability ($\mu_{DC}$) is the ratio of the magnetic flux to the magnetic field intensity at the point in question. For a reasonably steep loop, the permeability changes most rapidly as a function of the magnetic field in the vicinity of the coercive force, Hc. The incremental AC permeability is the ratio of the change in the AC magnetic flux to the change in the AC magnetic intensity and an AC hysteresis loop such as loop 30 would be used for this calculation. For this hysteresis loop, the AC permeability would not be as large as the DC. The steeper the sides of the curve (i.e., the more nearly truly rectangular the hysteresis curve loop becomes), the more sensitive the material is.

Figure 5:
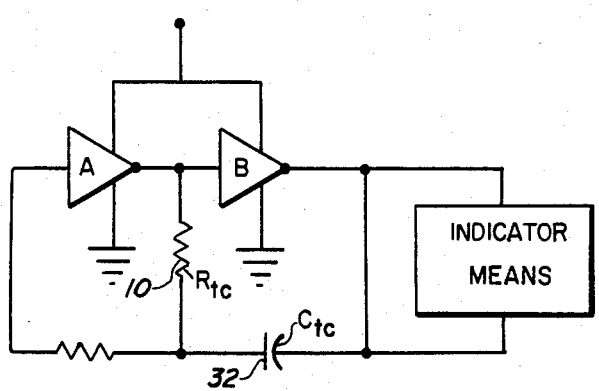
FIG. 5 is a circuit diagram of an oscillator circuit utilizing the field-sensitive element as part of its time-constant-determining means.

Other techniques and apparatus for measuring the resistance change of the sensor material may be employed. For example, FIG. 5 shows a conventional oscillator circuit of the multivibrator type in which the field-sensitive resistor 10 is used in conjunction with a capacitor 32 to form an RC-time-constant circuit which determines the frequency of the oscillator. When a magnetic field changes the resistance value of the field-sensitive element 10, the oscillation frequency changes.

Obviously, many modifications and variations of the present invention are possible in light of the above teachings. It is therefore to be understood that, within the scope of the appended claims, the invention may be practiced otherwise than as specifically described.

What is claimed is:

1. Apparatus for detecting a magnetic field comprising: magnetic sensing means consisting of a solid-state material having the property that its magnetic permeability is a function of the strength of any magnetic field which penetrates the material, and its skin depth and therefore its resistance are functions of its permeability, said solid-state material having a maximum permeability of about 750,000 and a steep hysteresis loop;

signal-producing means, connected to said magnetic field sensing means, said signal-producing means comprising a multivibrator oscillator wherein said magnetic-field sensing means and a capacitor forms an RC-time-constant circuit of said oscillator, whereby a change in resistance of the sensing means changes the frequency of oscillation of said oscillator; and indicator means, connected to said signal-producing means, for providing an indication of the existence of an output signal therefrom.

2. Apparatus as in claim 1, wherein:
said solid-state material is Metglas.

3. Apparatus as in claim 1, wherein:
said sensing means is formed in the shape of a rod approximately 0.002" by 0.002" in width and thickness and approximately 2" to 4" in length.

* * * * *